(12) United States Patent  
Corisis et al.

(10) Patent No.: US 8,115,112 B2
(45) Date of Patent: Feb. 14, 2012

(54) INTERPOSER SUBSTRATES AND SEMICONDUCTOR DEVICE ASSEMBLIES AND ELECTRONIC SYSTEMS INCLUDING SUCH INTERPOSER SUBSTRATES

(75) Inventors: David J. Corisis, Nampa, ID (US); Chin Hui Chong, Singapore (SG); Choon Kuan Lee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 507 days.

(21) Appl. No.: 12/201,222

(22) Filed: Aug. 29, 2008

(65) Prior Publication Data

US 2008/0316728 A1  Dec. 25, 2008

Related U.S. Application Data

(63) Continuation of application No. 11/511,184, filed on Aug. 28, 2006, now Pat. No. 7,425,758.

(51) Int. Cl.
*H05K 1/11* (2006.01)
(52) U.S. Cl. ........ 174/264; 174/255; 174/521; 174/546; 361/704; 361/751; 361/761; 257/659; 257/686; 257/691; 257/730; 257/734; 257/738; 257/778; 257/784; 438/106; 438/117; 438/126
(58) Field of Classification Search .................. 174/264, 174/255, 521, 546; 361/704, 751, 761; 257/686, 257/730, 734, 778, 784, 659, 691, 738; 438/106, 438/117, 126
See application file for complete search history.

(56) References Cited

U.S. PATENT DOCUMENTS

| | | | |
|---|---|---|---|
| 5,151,769 A | 9/1992 | Immorlica et al. | |
| 5,347,159 A | 9/1994 | Khandros et al. | |
| 5,386,341 A | 1/1995 | Olson et al. | |
| 5,394,303 A | 2/1995 | Yamaji | |
| 5,448,511 A | 9/1995 | Paurus et al. | |
| 5,552,910 A | 9/1996 | Okano | |
| 5,646,446 A | 7/1997 | Nicewarner, Jr. et al. | |
| 5,764,484 A * | 6/1998 | Hoffman et al. | 361/761 |
| 5,776,797 A | 7/1998 | Nicewarner, Jr. et al. | |
| 5,904,496 A | 5/1999 | Richards et al. | |
| 5,982,030 A | 11/1999 | MacIntrye | |
| 6,028,365 A | 2/2000 | Akram et al. | |
| 6,072,238 A * | 6/2000 | Viswanathan et al. | 257/719 |

(Continued)

FOREIGN PATENT DOCUMENTS

DE  10227305  9/2003

(Continued)

OTHER PUBLICATIONS

International Search Report dated Apr. 11, 2008, for International Application No. PCT/US2007/076286 (4 pages).

(Continued)

*Primary Examiner* — Xiaoliang Chen
(74) *Attorney, Agent, or Firm* — TraskBritt (57) ABSTRACT

Chip-scale packages and assemblies thereof are disclosed. The chip-scale package includes a core member of a metal or alloy having a recess for at least partially receiving a die therein and includes at least one flange member partially folded over another portion of the core member. Conductive traces extend from one side of the package over the at least one flange member to an opposing side of the package. Systems including the chip-scale packages and assemblies are also disclosed.

30 Claims, 5 Drawing Sheets

U.S. PATENT DOCUMENTS

| | | | |
|---|---|---|---|
| 6,160,705 A * | 12/2000 | Stearns et al. | 361/704 |
| 6,172,418 B1 | 1/2001 | Iwase | |
| 6,208,521 B1 | 3/2001 | Nakatsuka | |
| 6,225,688 B1 | 5/2001 | Kim et al. | |
| 6,287,890 B1 * | 9/2001 | Ho | 438/106 |
| 6,291,892 B1 * | 9/2001 | Yamaguchi | 257/778 |
| 6,300,679 B1 | 10/2001 | Mukerji et al. | |
| 6,365,434 B1 | 4/2002 | Rumsey et al. | |
| 6,376,769 B1 | 4/2002 | Chung | |
| 6,486,544 B1 | 11/2002 | Hashimoto | |
| 6,563,223 B2 | 5/2003 | Freeman | |
| 6,576,992 B1 | 6/2003 | Cady et al. | |
| 6,586,846 B2 * | 7/2003 | Ho | 257/784 |
| 6,600,222 B1 | 7/2003 | Levardo | |
| 6,706,553 B2 * | 3/2004 | Towle et al. | 438/106 |
| 6,833,614 B2 | 12/2004 | Higuchi | |
| 6,914,324 B2 | 7/2005 | Rapport et al. | |
| 6,919,626 B2 | 7/2005 | Burns | |
| 6,940,729 B2 | 9/2005 | Cady et al. | |
| 6,955,945 B2 | 10/2005 | Rapport et al. | |
| 6,956,284 B2 | 10/2005 | Cady et al. | |
| 7,026,708 B2 | 4/2006 | Cady et al. | |
| 7,053,478 B2 | 5/2006 | Roper et al. | |
| 7,094,632 B2 | 8/2006 | Cady et al. | |
| 7,309,914 B2 * | 12/2007 | Goodwin | 257/686 |
| 7,425,758 B2 * | 9/2008 | Corisis et al. | 257/686 |
| 7,453,155 B2 | 11/2008 | Hsu | |
| 7,563,645 B2 * | 7/2009 | Jaeck | 438/117 |
| 2001/0054756 A1 * | 12/2001 | Horiuchi et al. | 257/678 |
| 2002/0001178 A1 * | 1/2002 | Iijima et al. | 361/704 |
| 2003/0207501 A1 * | 11/2003 | Schoenfeld et al. | 438/128 |
| 2004/0000707 A1 | 1/2004 | Roper et al. | |
| 2004/0115866 A1 | 6/2004 | Bang et al. | |
| 2004/0150088 A1 * | 8/2004 | Corisis | 257/684 |
| 2004/0217471 A1 * | 11/2004 | Haba | 257/734 |
| 2005/0009234 A1 | 1/2005 | Partridge et al. | |
| 2005/0073846 A1 | 4/2005 | Takine | |
| 2005/0098873 A1 | 5/2005 | Wehrly, Jr. | |
| 2005/0104205 A1 * | 5/2005 | Wang | 257/730 |
| 2005/0242423 A1 * | 11/2005 | Partridge et al. | 257/686 |
| 2005/0280135 A1 | 12/2005 | Rapport et al. | |
| 2006/0055038 A1 | 3/2006 | Mu | |
| 2008/0048309 A1 * | 2/2008 | Corisis et al. | 257/686 |
| 2008/0299709 A1 * | 12/2008 | Corisis et al. | 438/126 |
| 2010/0276799 A1 | 11/2010 | Heng et al. | |

FOREIGN PATENT DOCUMENTS

TW　　　　I260792　　　8/2006

OTHER PUBLICATIONS

International Preliminary Report on Patentability dated Mar. 3, 2009 for International Application No. PCT/US2007/076286 (7 pages).
Written Opinion dated Apr. 11, 2008, for International Application No. PCT/US2007/076286 (5 pages).
TW Search Report for TW Application No. 096131721 completed Nov. 27, 2010, 2 pages.

* cited by examiner

INTERPOSER SUBSTRATES AND SEMICONDUCTOR DEVICE ASSEMBLIES AND ELECTRONIC SYSTEMS INCLUDING SUCH INTERPOSER SUBSTRATES

CROSS-REFERENCE TO RELATED APPLICATIONS

This application is a continuation of application Ser. No. 11/511,184, filed Aug. 28, 2006, now U.S. Pat. No. 7,425,758, issued Sep. 16, 2008, the disclosure of which is incorporated by reference herein in its entirety. This application is also related to application Ser. No. 12/180,880, filed Jul 28, 2008, now U.S. Pat. No. 7,915,077, issued Mar 29, 2011.

TECHNICAL FIELD

Embodiments of the invention relate to chip-scale packages (CSPs), stacking integrated such CSPs in a multi-chip module (MCM) structure in a package-on-package (POP) configuration, and methods of forming such packages and structures.

BACKGROUND

Semiconductor dice are conventionally packaged individually in transfer-molded resin packages or, less commonly, ceramic packages. Packaging supports, protects, and (in some instances) dissipates heat from the semiconductor die and provides a lead system for power and ground or bias, as well as signal distribution to and from the semiconductor die or dice within. The die package may also facilitate burn-in and other testing of each semiconductor die or dice in the package prior to and after its assembly with higher-level packaging.

One type of integrated circuit (IC) or semiconductor die package is referred to as a "chip-scale package," "chip-size package," or merely "CSP." These designations relate to the physical dimensions of the package, which are only nominally larger than the actual dimensions (length, width, and height) of the unpackaged semiconductor die. Chip-scale packages may be fabricated in "uncased" or "cased" configurations. Uncased chip-scale packages do not include encapsulation or other covering of the sides of a semiconductor die extending between the active surface and back side thereof, and thus exhibit a "footprint" (peripheral outline) that is substantially the same as that of an unpackaged semiconductor die. Cased chip-scale packages have encapsulated or otherwise covered sides and thus exhibit a peripheral outline that is slightly larger than that of an unpackaged semiconductor die. For example, a surface area of a footprint for a conventional cased chip-scale package may be up to about 1.2 times that of the bare semiconductor die contained within the package.

A chip-scale package may include an interposer substrate bonded to a surface of the semiconductor die. The interposer substrate conventionally includes traces extending to contacts for making external electrical connections to the semiconductor die of the chip-scale package. The interposer substrate for a chip-scale package may conventionally comprise a flexible material, such as a polymer (i.e., polyimide) tape such as KAPTON® tape, or a rigid material, such as silicon, ceramic, glass, BT (Bismaleimide Triazine) resin, or an FR-4 or other fiberglass laminate. The external contacts for one type of chip-scale package include solder balls or other discrete conductive elements protruding from the package and arranged in an array. Such a design is termed a "ball grid array" (BGA), or a "fine ball grid array" (FBGA) for such an array configuration having a very closely spaced, or pitched, array of discrete conductive elements. BGA and FBGA packaging provides the capability for a high number of inputs and outputs (I/Os) for a chip-scale package, several hundred I/Os being easily achieved if necessary or desirable.

Integrated circuit packaging surface mount technology, such as so-called "vertical surface mount packages" or "VSMP" technology, has also provided an increase in semiconductor die density on a single carrier substrate, such as a circuit board, as the die packages are mounted transverse to the plane of the carrier substrate. This configuration results in more compact designs and form factors and a significant increase in integrated circuit density. However, many VSMP designs are somewhat costly to implement and require fairly complex and sophisticated carrier substrates. In addition, for some applications, the relatively large distance of protrusion of the VSMPs above the carrier substrate is unacceptable for compact applications where vertical height is an issue and, for other applications unacceptably limits the number of carrier substrates which may be inserted transversely in adjacent slots of a higher-level packaging substrate, such as a PC motherboard.

Higher performance, lower cost, increased miniaturization of components, and greater packaging density of integrated circuits are ongoing goals of the computer industry. As new generations of integrated circuit products are released, the volume and thus cost of components used in packaging tends to decrease due to advances in packaging technology, even though the functionality (memory capacity and speed, processor speed, etc.) of the packaged end products increase. For example, on average there is approximately a ten percent decrease in packaging component volume for every product generation, as compared to the previous generation exhibiting equivalent functionality.

Chip-scale packages are thus of current interest in modern semiconductor packaging as a method for reducing both package size and cost. Further, the industry has responded to the limited space or "real estate" available for mounting semiconductor dice on a carrier substrate by vertically stacking two or more semiconductor dice, the I/Os of the die stack connecting to the carrier substrate often being provided between the lowermost semiconductor die and carrier substrate within the footprint of the stack. Therefore, it would be advantageous to provide a method and apparatus that may further reduce chip-scale package size and enhance robustness and heat transfer capabilities of the package while at the same time reduce fabrication cost and enhance production flexibility in combination with providing a capability to stack two or more semiconductor dice of the same or different types to increase circuit density on a carrier substrate to which such a multi-die chip-scale package is attached.

DESCRIPTION OF THE INVENTION

Embodiments of chip-scale packages are disclosed, as well as to embodiments of methods of fabricating such packages including, by way of example only, Chip-On-Board (COB) and Board-On-Chip (BOC) packages. Also disclosed are embodiments of vertically stacked Package-On-Package (POP) modules, and systems including COB and BOC packages and POP modules.

Embodiments of the chip-scale package may include a core member formed from a metal or metal alloy and having at least one portion partially folded over itself. These embodiments provide a minimized footprint, substantially chip-scale package of robust design exhibiting enhanced rigidity that provides a capability of stacking multiple semiconductor dice. Such embodiments also provide a capability to convert semiconductor dice exhibiting a peripheral or central bond pad I/O arrangement into array-type chip-scale packages. Yet a further advantage of the various embodiments of chip-scale packages of the present invention is improved thermal and circuit performance.

The present invention, in various embodiments, relates to chip-scale packages exhibiting arrays of external contacts, as well as to methods of fabricating such packages including, by way of example only, ball grid array chip-scale packages.

One embodiment of the invention comprises an interposer substrate that includes a core member. The core member provides, among others, a die attach area for receiving a semiconductor die and at least one folded flange member that extends both laterally away from and back toward and above the die attach area. Two opposing flange members may be employed. Additionally, the interposer substrate provides signal, ground or bias and power routing structures that are insulated from the core member by a dielectric material that may be at least partially supported by the flange members. The routing structures may further include conductive elements that provide electrical communication to the semiconductor die, another package, a carrier substrate, and the like.

Another embodiment of the invention includes a board-on-chip (BOC) semiconductor device assembly. A semiconductor die with a plurality of bond pads on an active surface may be disposed over a die attach area of a core member of the interposer substrate with the active surface of the die disposed, face down, on the die attach area. The plurality of bond pads may be accessible through at least one aperture in the form of a groove or slot formed in the core member that corresponds to the location of the plurality of bond pads. Flange members of the interposer substrate may extend laterally away from the semiconductor die attach area on opposing sides thereof and fold back over at least a portion of the core member toward the semiconductor die. Additionally, the interposer substrate provides signal, ground or bias and power routing structures that are insulated from the core member by a dielectric material that may be at least partially supported by the flange members. The routing structures may include conductive traces that provide electrical communication paths to locations proximate the bond pads of the semiconductor die. The conductive traces may also provide electrical communication to other conductive interconnects for external connection and which may include discrete conductive elements in the form of pads or lands, balls, bumps, studs, columns, pillars, or pins. At least a second semiconductor device assembly may be stacked with the first semiconductor device assembly in a substantially superimposed manner. The conductive interconnects may be used to provide electrical communication, as well as thermal conduction, between the stacked semiconductor device assemblies.

Yet another embodiment of the invention includes a chip-on-board (COB) semiconductor device assembly. A semiconductor die with a plurality of bond pads on an active surface may be disposed over and secured by its back side to a die attach area of an insulative layer located within a cavity of a core member of the interposer substrate. Flange members of the core member may extend laterally from the semiconductor die attach area on opposing sides thereof and fold back over at least a portion of the core member toward the semiconductor die. Additionally, the interposer substrate provides signal, ground or bias and power routing structures that are insulated from the core member by a dielectric material and at least partially supported by the flange members. The routing structures may include conductive traces that provide electrical communication to locations proximate the bond pads of the semiconductor die. The conductive traces provide electrical communication to other conductive interconnects, which may comprise discrete conductive elements in the form of pads or lands, balls, bumps, studs, columns or pillars, pins or other conductive elements, or other conductive structures such as a Z-axis (anisotropic) conductive film. At least a second semiconductor device assembly may be stacked with the first semiconductor device assembly in a substantially superimposed manner. The conductive interconnects may provide electrical communication, as well as thermal conduction, between the stacked semiconductor device assemblies.

Embodiments of methods of fabricating the chip-scale packages of the present invention, as well as assemblies of higher-level packaging incorporating the inventive packages are also encompassed by the invention.

Systems including one or more semiconductor dice packaged in accordance with one or more embodiments of the present invention are also encompassed by the invention.

In the description which follows, like features and elements have been identified by the same or similar reference numerals for ease of identification and enhanced understanding of the disclosure hereof. Such identification is by way of convenience for the reader only, however, and is not limiting of the present invention or an implication that features and elements of various components and embodiments identified by like reference numerals are identical or constrained to identical functions.

Figure 1:
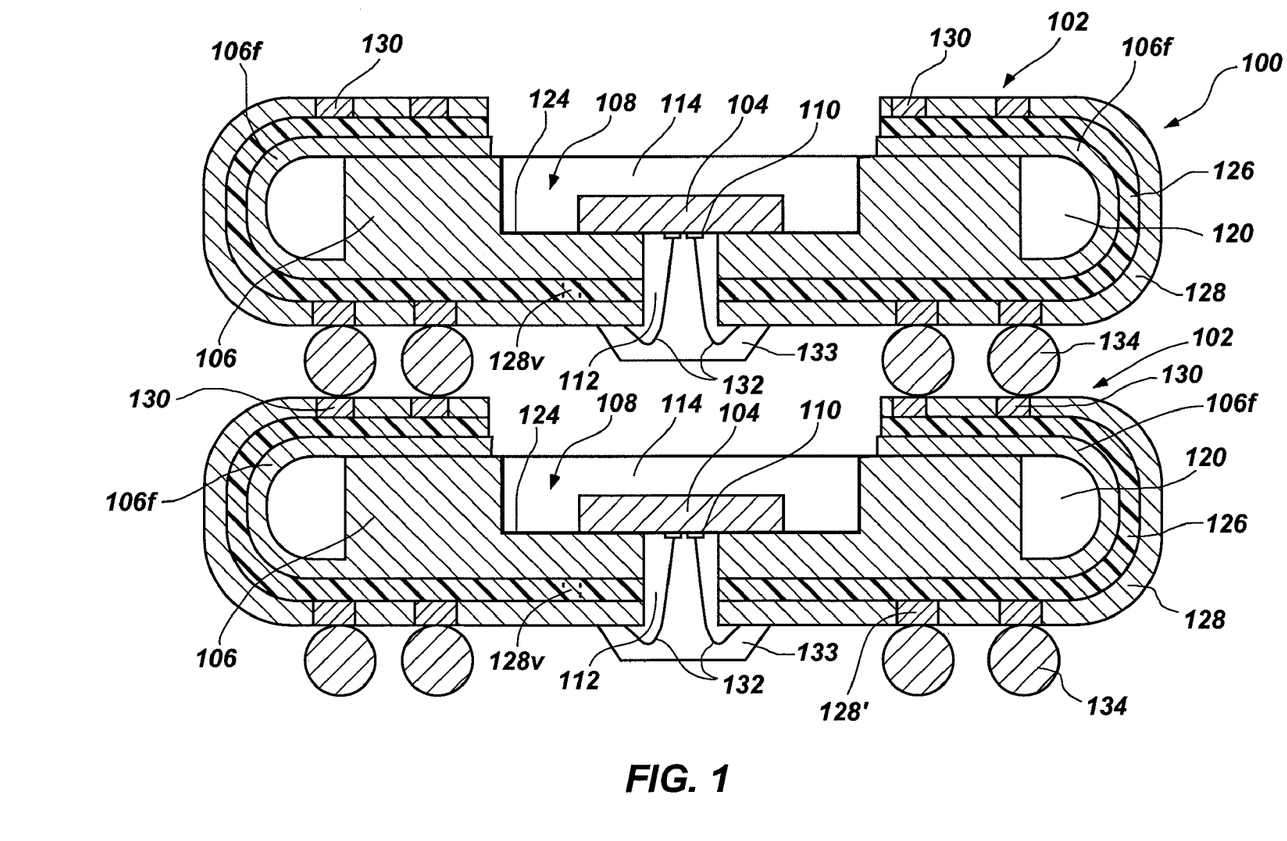
FIG. 1 is an embodiment of a Board-On-Chip package-on-package assembly according to an embodiment of the present invention.

A first embodiment of a Board-On-Chip (BOC) package-on-package assembly 100 according to the present invention may be seen in FIG. 1. The BOC semiconductor device assemblies 102 included in package-on-package (POP) assembly 100 depicted in FIG. 1 each include an electronic device, such as a semiconductor die 104, may be disposed with its active surface facing downward upon a core member 106, in an upward-facing (as the drawing is oriented), substantially central recess 108 thereof with bond pads 110 of semiconductor die 104 exposed through at least one aperture 112 configured as a groove or slot extending through core member 106 from central recess 108 to an opposing surface thereof. Core member 106 may comprise, by way of example only, copper or Alloy 42, a nickel-iron alloy. Aluminum and aluminum alloys may also be suitable materials. Each BOC semiconductor device assembly 102 may further include a dielectric layer 126, such as a polyimide layer, surrounding aperture 112 and extending over the opposing surface of core member 106. Conductive traces 128 are disposed over dielectric layer 126 and extend from locations adjacent aperture 112 around the exterior surface of dielectric layer 126 to terminate at terminal pads 130 on the opposing side of the BOC semiconductor device assembly 102. The term "conductive traces" is used herein in a nonlimiting sense, and may comprise, for example, metal conductive paths in the form of thin sheet material, stenciled conductive paths, or conductive paths of other materials and configurations. Terminal pads 130 may comprise enlarged segments of conductive traces 128. Conductive elements 132 in the form of, for example, wire bonds or traces on dielectric tape comprising TAB (tape automated bonding) type connections may be used to connect the semiconductor die 104 to the conductive traces 128. A dielectric material 133, for example, a transfer-molded silicon particle-filled thermoplastic resin, may be employed to fill the at least one aperture 112 and cover bond pads 110, conductive elements 132 and the connection thereof to proximate ends of conductive traces 128. Conductive interconnects in the form of discrete conductive elements 134 may be formed on at least some of the conductive traces 128 on the underside (as the drawing figure is oriented) of each BOC semiconductor device assembly 102, on enlarged portions 128' thereof as shown. Discrete conductive elements 134 may comprise, for example, pads or lands, balls, bumps, studs, columns or pillars, pins or other discrete conductive elements. Discrete conductive elements 134 may comprise a metal, an alloy (including, for example, solders), a metal or alloy-covered nonconductive element, a conductive epoxy, or a conductor-filled epoxy, by way of example only.

The core member 106 may provide a rigid platform from which a semiconductor package may be formed; the core member 106 may provide sufficient rigidity to the package so that the core member 106 can be run on existing semiconductor assembly lines developed for processing of lead frame-based packages. As noted above, the core member 106 may have a recess 108 for receiving an electronic device such as a semiconductor die 104 and at least one aperture 112 that extends through the core member 106 from recess 108 to the exterior of the dielectric layer 126 adjacent ends of conductive traces 128. The at least one aperture 112 may be a single hole, a series of holes, a slot, or other shape having dimensions that expose bond pads 110 on the active surface of semiconductor die 104 therethrough and enable conductive elements 132 to be extended between bond pads 110 and adjacent ends of conductive traces 128 disposed on dielectric layer 126. In the example shown, bond pads 110 extend in parallel rows along and transverse to a centerline of semiconductor die 104 (which, in the example shown, lies perpendicular to the drawing sheet), and the at least one aperture 112 comprises a slot. When disposed in recess 108, active surface of semiconductor die 104 is in at least partial contact with a dielectric, passivating layer 124 disposed at least on the floor of recess 108 of the core member 106 to electrically isolate the semiconductor die 104 from electrically conductive core member 106 and, optionally, over the walls of recess 108 and the walls of the at least one aperture 112.

Passivating layer 124 may comprise a nonconductive adhesive, or a double-sided adhesive tape (such as KAPTON® tape) configured as a frame around the at least one aperture 112, or tape strips or other segments lying adjacent the at least one aperture 112 on the floor of recess 108. The passivating layer 124 may also be applied by a chemical vapor deposition (CVD) process, stereolithographic process, spray process, or other suitable methods known in the art. A dielectric underfill or encapsulant material 114, which may be thermally conductive, may at least partially fill the recess 108 and cover the back and sides of semiconductor die 104. The core member 106 may have a coefficient of thermal expansion (CTE) similar to that of the dielectric layer 126, for example, so that the core member 106 does not delaminate from the dielectric layer 126 under thermal cycling-induced stress. The core member 106 may also exhibit good thermal conductivity, which may aid in transferring heat from the semiconductor die 104 to the exterior. Further, the core member 106 may be used as a ground or bias plane, or a shielding plane, for the semiconductor die 104.

Core member 106 may have at least one flange member 106f (two opposing flange members shown) extending from a central portion thereof proximate a die attach area thereof in which recess 108 resides. Each flange member 106f may be formed such that the flange member 106f is folded over to oppose an upper surface of the core member 106 and may optionally be secured thereto. Described in another fashion, a first, proximal segment or portion of each flange member 106f extends away from recess 108 to a second, intermediate segment or portion thereof comprising an arcuate segment, which, in turn, extends into a third, distal segment that extends back toward, and over, the upper surface of the central portion of the core member 106. If each flange member 106f is folded in this manner, flange members 106f may form voids 120, flanking the central portion of the core member 106. The voids 120 may permit air or other fluids to pass through the BOC semiconductor device assembly 102 to aid in cooling. Alternatively, the voids 120 may be at least partially filled with a thermally conductive dielectric or encapsulant (not shown).

Dielectric layer 126 may be applied in flowable form to core member 106, or may comprise a preformed film bonded to the core member 106 by a suitable adhesive (not shown), which may include epoxies, thermoset or thermoplastic adhesives, or other adhesives known in the art. The dielectric layer 126 may be flexible, as well as thermally conductive and may exhibit sufficient elasticity such that it does not crack, break, or otherwise fail as it is folded over the core member 106 with the flange member 106f to which it is secured.

Conductive traces 128 and conductive elements 132 provide electrical communication between the semiconductor die 104 and discrete conductive elements 134, enabling electrical communication between each BOC semiconductor device assembly 102 and another BOC semiconductor device assembly 102 stacked thereon or thereunder, to a carrier substrate such as a printed circuit board, or to other higher-level packaging. Further, at least one of the conductive traces 128 may be connected through a conductive via 128v in dielectric layer 126 to the core member 106 to provide a ground or voltage bias plane. Conductive traces 128 may be formed by, for example, blanket depositing of copper or another metal or alloy on dielectric layer 126, masked, patterned and etched, as is known in the art. Alternatively, conductive traces 128 may be preformed on a film comprising dielectric layer 126 and applied with dielectric layer 126 to core member 106. Conductive via 128v may be formed by etching or otherwise perforating dielectric layer 126, followed by filling with any suitable conductive material.

One or more BOC semiconductor device assemblies 102 may be stacked in a substantially vertical manner with other BOC semiconductor device assemblies 102, as illustrated in FIG. 1. The conductive interconnects comprising discrete conductive elements 134 of each BOC semiconductor device assembly 102 enable electronic communication and mechanical securement between the BOC semiconductor device assemblies 102, as well as provide ground or bias voltage, power and signal routing to and between package-on-package assembly 100 and higher-level packaging. If the discrete conductive elements 134 and dielectric layer 126 are thermally conductive, the flow of heat may be facilitated through the vertical stack to a heat sink (not shown), the exterior of the package-on-package assembly 100, or other means of disposing of excess heat known in the art. Optionally, the package-on-package assembly 100 may be at least partially covered with encapsulant (not shown) as known in the art.

Figure 2:
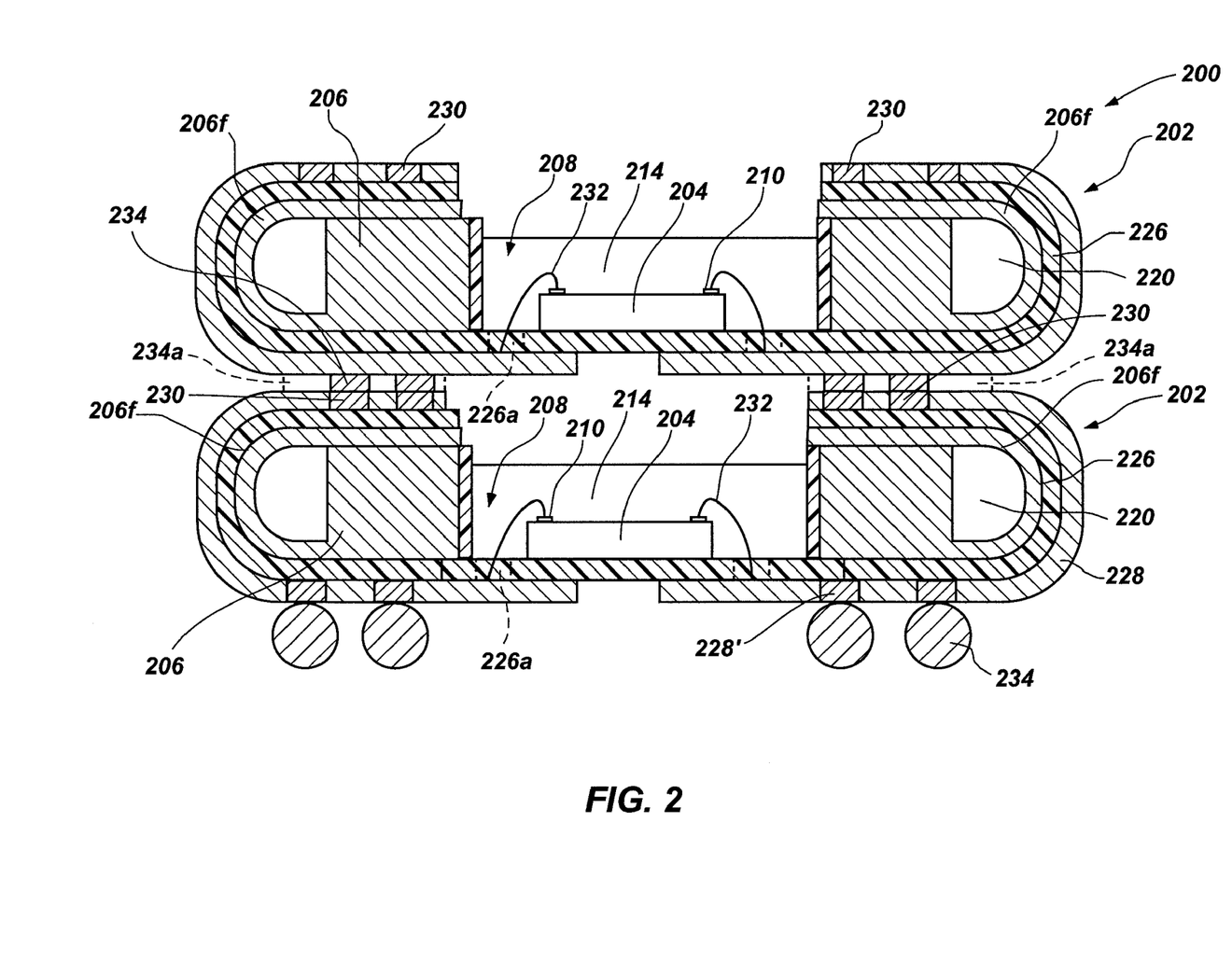
FIG. 2 is an embodiment of a Chip-On-Board package-on-package assembly according to an embodiment of the present invention.

Another embodiment of the present invention may be seen in FIG. 2, which illustrates a vertical Chip-On-Board (COB) package-on-package (POP) assembly 200 comprising a plurality of COB semiconductor device assemblies 202. A COB semiconductor device assembly 202 may include an electronic device in the form of a semiconductor die 204, a core member 206, a dielectric layer 226, conductive traces 228 and conductive interconnects in the form of discrete conductive elements 234.

The core member 206 may provide at least a substantially rigid support from which a semiconductor package may be formed; the core member 206 may be sufficiently rigid so that the core member 206 can be run on existing semiconductor assembly lines. A recess 208 may be formed in the core member 206, exposing at least part of the dielectric layer 226, the dimensions of the recess 208 providing a volume sufficient to receive the semiconductor die 204. A dielectric material or encapsulant 214, which may be thermally conductive, may fill the recess 208 and at least partially cover the semiconductor die 204. The core member 206 may have a coefficient of thermal expansion (CTE) similar to the dielectric layer 226, for example, so that the core member 206 does not delaminate from the dielectric layer 226. The core member 206 may also exhibit good thermal conductivity, which may aid in transferring heat from the semiconductor die 204 to the exterior of the assembly. Further, the core member 206 may be employed as a ground or a shielding plane for the semiconductor die 204. If core member 206 is used as a ground plane, an electrical connection may be effected between the semiconductor die 204 and core member 206 using, for example, a conductive or conductor-filled epoxy paste. As with the embodiment of FIG. 1, examples of materials that may be suitable for the core member 206 include copper, Alloy 42 and aluminum, or aluminum alloys.

Core member 206 may have at least one flange member 206f (two opposing flange members shown) extending from a central portion thereof proximate a die attach area thereof in which recess 208 resides. Each flange member 206f may be formed such that the flange member 206f is folded over to oppose an upper surface of the core member 206 and may optionally be secured thereto. Described in another fashion, a first, proximal segment or portion of each flange member 206f extends away from recess 208 to a second, intermediate segment or portion thereof comprising an arcuate segment, which, in turn, extends into a third, distal segment that extends back toward, and over, the upper surface of the central portion of the core member 206. If each flange member 206f is folded in this manner, flange members 206f may form voids 220 flanking the central portion of the core member 206. The voids 220 may permit air or other fluids to pass through the COB semiconductor device assembly 202 to aid cooling. Alternatively, the voids 220 may be at least partially filled with a thermally conductive dielectric or encapsulant (not shown).

Semiconductor die 204 may have bond pads 210 disposed upon an active surface thereof. One example of such semiconductor die 204 as illustrated in FIG. 2 may have bond pads 210 disposed substantially along at least one peripheral edge thereof, bond pads 210 disposed along two opposing peripheral edges being shown. The back side of semiconductor die 204 may be attached to the dielectric layer 226 with an adhesive or bonding agent, as known in the art.

Dielectric layer 226 may comprise a film bonded to the core member 206 by an adhesive (not shown), which may include epoxies, thermoset or thermoplastic adhesives, or other adhesives known in the art. Dielectric layer 226 may also be flexible, as well as thermally conductive. The flexible dielectric layer 226 may exhibit sufficient elasticity such that it does not crack, break, or otherwise fail as it is folded over the core member 206 with the flange member 206f. One suitable material for flexible dielectric layer 226 may be a polyimide film, another being a solder mask material, yet another being a die attach film (DAF). The dielectric layer 226 may have conductive traces 228 extending from locations adjacent the periphery of semiconductor die 204 and over flange members 206f to terminate at terminal pads 230, in a manner similar to that described and depicted with respect to the embodiment of FIG. 1. The conductive traces 228 may be connected to bond pads 210 by conductive elements 232, which may comprise bond wires or TAB type connections. In the embodiment shown, conductive elements 232 may extend through apertures 226a, as shown in broken lines, in dielectric layer 226. Conductive traces 228 provide electrical communication between the semiconductor die 204 and conductive interconnects in the form of discrete conductive elements 234, which may, in turn, be used to provide electrical communication between the COB semiconductor device assembly 202 and another stacked package, carrier substrate, or the like. Further, at least another of the discrete conductive elements 234 may connect to the core member 206 and to semiconductor die 204 by one or more suitably placed conductive vias as discussed with respect to the embodiment of FIG. 1, to provide a ground or bias voltage plane.

Conductive interconnects in the form of discrete conductive elements 234 may be disposed on enlarged portions 228' of conductive traces 228 and provide a means of external communication for the semiconductor die 204 in a manner similar to that described and depicted with respect to the embodiment of FIG. 1. The discrete conductive elements 234 may comprise, for example, pads or lands, balls, bumps, studs, columns or pillars, pins or other discrete conductive elements. Alternatively, an anisotropically conductive (Z-axis) adhesive film 234a, as shown in broken lines may be employed in lieu of discrete conductive elements. If discrete conductive elements 234 are employed, they may comprise a metal, an alloy (including, for example, solders), a metal or alloy-covered nonconductive element, a conductive epoxy, or a conductor-filled epoxy, by way of example only. The discrete conductive elements 234 or other interconnect structure may also be thermally conductive as well. As shown with respect to the connections between the upper and lower COB semiconductor device assemblies 202 in FIG. 2, use of discrete conductive elements 234 conductive lands or pins, or an anisotropically conductive adhesive film 234a provides a notable height reduction in a POP assembly 200, which is enabled by the lack of any downwardly protruding structure in COB semiconductor device assemblies 202, in comparison to BOC semiconductor device assemblies 102, wherein the conductive elements 132 and encapsulation thereof protrude below conductive traces 128, as shown in FIG. 1.

One or more COB semiconductor device assemblies 202 may be stacked in a substantially vertical manner with other COB semiconductor device assemblies 202 to form a POP assembly 200, as illustrated in FIG. 2. The discrete conductive elements 234 of each COB semiconductor device assembly 202, through terminal pads 230 and conductive traces 228, may permit electronic communication between the COB semiconductor device assemblies 202, as well as to a carrier substrate such as a printed circuit board, or to other higher-level packaging. If the discrete conductive elements 234 and dielectric layer 226 are thermally conductive, heat may flow through the vertical stack to a heat sink (not shown), the exterior of the COB semiconductor device assembly 202, or other means of disposing of excess heat known in the art. Optionally, the POP assembly 200 may be at least partially covered with encapsulant (not shown) as known in the art.

Notably and as mentioned above, the embodiment of FIG. 2, which does not require clearance below (as the drawing figure is oriented) each COB semiconductor device assembly 202 to accommodate protruding wire bonds, other conductive elements connecting to conductive traces, may employ pin or land grid array type discrete conductive elements 234, as shown, to reduce stack height.

Figure 3:
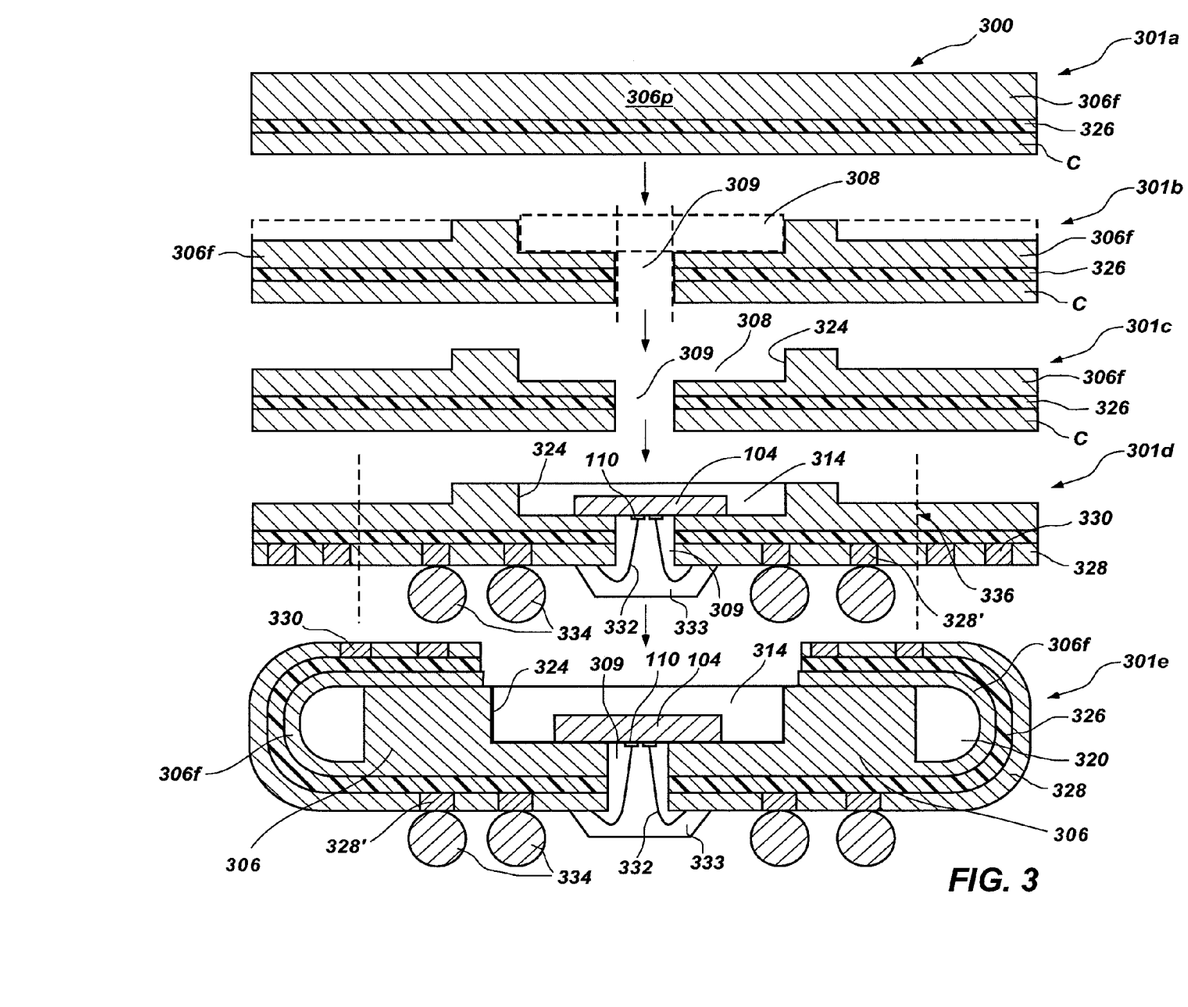
FIG. 3 depicts an embodiment of a sequence of acts in a method of manufacturing a Board-On-Chip assembly according to an embodiment of the present invention.

Methods of forming copper core members, semiconductor device assemblies, and semiconductor device assembly POP stacks also fall within the scope of the present invention. Illustrated in FIG. 3 is one embodiment of a method of forming a BOC package. FIG. 3, segment 301a, illustrates a precursor structure 300 comprising a metal or alloy core base 306p, a precursor structure for the formation of a core member 306, disposed on a dielectric layer 326, which, in turn, is disposed on a thinner conductive layer C.

Metal or alloy core base 306p may be formed, by way of example only, by electroplating or electroless plating and may be of, for example, 500 μm thickness. Metal or alloy core base 306p may be adhered to the dielectric layer 326 by a bonding agent (not shown), such as an epoxy, adhesive, adhesive tape, among other methods known in the art. The bonding agent may be applied to the core base 306p, the dielectric layer 326, or both. One example of a flexible dielectric material may be a polyimide film or tape. Alternatively, dielectric layer 326 may be disposed on metal or alloy core base 306p in flowable form, such as with a spin-on technique (not shown).

Conductive layer C is a precursor structure to conductive traces 328 that terminate at terminal pads 330 (FIG. 3, segments 301d and 301e). Conductive traces 328 may be formed by the aforementioned masking, patterning and etching after conductive layer C is applied or blanket-deposited onto dielectric layer 326, or preformed and applied to dielectric layer 326. In addition, and as previously noted, conductive traces 328 comprise conductive paths suitably formed and may be configured of any suitable material.

Segment 301b of FIG. 3 illustrates an intermediate act in the manufacturing process. Cavity 308, which may form a recess 108 for receiving a semiconductor die 104, as seen in FIG. 1, may be formed in the core base 306p by mechanical techniques, such as milling or chemical techniques, such as a masking, patterning and chemical (wet) etching process, or other such methods of forming cavities in metals that are known in the art. The depth of the cavity 308 may be substantially the same as or greater than the height of a semiconductor die 104 to be disposed therewithin, although a cavity 308 having a depth less than the height of the semiconductor die 104 falls within the scope of the invention.

An aperture or trench 309 may be formed through core base 306p and dielectric layer 326 from the bottom of cavity 308 in the form of at least one slot or groove. The size and shape of the at least one slot or groove may be selected to provide access therethrough to bond pads of a semiconductor die disposed active surface down in cavity 308 and to provide sufficient clearance for a capillary of automated wire bonding equipment to join bond pads (not shown) on the semiconductor die with conductive traces 328. The trench 309 may be formed by mechanical techniques, such as drilling, chemical techniques, such as a masking, patterning and (wet) chemical etching process, or other such methods of forming cavities that are known in the art.

Flanges 306f, flanking the central portion of core base 306p and spaced from cavity 308, may also be formed in the core base 306p by thinning using mechanical techniques such as milling, chemical techniques, such as a masking, patterning and chemical (wet) etching process, or other such methods of reducing a thickness of a metal that are known in the art, the resulting structure now comprising core member 306, corresponding to core member 106 of FIG. 1. Flanges 306f correspond to flange members 106f of the core member 106 as seen in FIG. 1. The volume of core base 306p removed in the process to form the flanges 306f may be substantially sufficient to ensure the flanges 306f have the requisite ductility needed to plastically fold a portion of each flange 306f back toward the central portion of core member 306, as discussed below.

Segment 301c of FIG. 3 illustrates another intermediate act in the manufacturing process. A dielectric, passivating layer 324 may be disposed on the floor of cavity 308 of core member 306 and, optionally, over the walls of cavity 308 and the exposed portions of the dielectric layer 326 in the area of the walls of trench 309. The dielectric layer 324 may be applied by a chemical vapor deposition (CVD) process, stereolithographic process, spray process, or other suitable methods known in the art. If only disposed on the floor of cavity 308, dielectric layer 324 may comprise a preformed dielectric tape or film, as previously mentioned.

Segment 301d of FIG. 3 illustrates positioning a semiconductor die 104 within the cavity 308 of core member 306. A bonding agent (not shown), such as an epoxy, thermoset or thermoplastic adhesive, heat or light curable polymer, adhesive coated tape, or the like, may be applied to the floor of cavity 308 over the dielectric layer 324 to secure semiconductor die 104 by its active surface with bond pads 110 aligned with trench 309, unless dielectric layer 324 is already adhesive in nature. Alternatively, the bonding agent may be applied to the semiconductor die 104 in the form of, for example, LOC (Leads On Chip) adhesive coated tape segments, and used to form dielectric layer 324. Semiconductor die 104 may be positioned within the cavity 308 by a pick and place apparatus using, for example, a vacuum quill, or other by another suitable technique known in the art.

A wire bonding process, or a TAB process, may be used to form or connect conductive elements 332, joining at least some of the bond pads 110 on the semiconductor die 104 through the trench 309 to proximate ends of the conductive traces 328 disposed on the dielectric layer 326.

Also visible in segment 301d of FIG. 3 are conductive interconnects in the form of discrete conductive elements 334, corresponding to discrete conductive elements 134 of FIG. 1. The discrete conductive elements 334 may be formed or disposed on enlarged areas 328' of conductive traces 328 disposed on the dielectric layer 326 and provide, in conjunction with the conductive traces 328 and conductive elements 332, external electrical communication for the semiconductor die 104. A dielectric encapsulant 314, such as an underfill compound, may be dispensed within the cavity 308 to protect the back side and sides of semiconductor die 104. Trench 309 may be filled and conductive elements 332 covered with another dielectric encapsulant 333, such as a silicon-filled thermoplastic resin, in a transfer molding operation. Alternatively, stereolithographic techniques using a photopolymer may be employed, or pot molding of a resin, or glob top encapsulation using a silicone. Encapsulation may be effected prior to, or after, formation or disposition of discrete conductive elements 334 on conductive traces 328.

Segment 301e of FIG. 3 illustrates a completed semiconductor device assembly after the flanges 306f of the core member 306 have been folded over the top of the core member 306 to locations proximate cavity 308, resting and in contact with unthinned portions of core member 306. Voids 320 are formed between folded-over flanges 306f and the central portion of core member 306. Dashed vertical lines 336, visible in segment 301d of FIG. 3, indicate the approximate location of the fold, it being understood that the length of flanges 306f as depicted are not to scale. The folding process is a simple mechanical process, and effected using conventional trim-and-form equipment by applying a bending force at or substantially near the distal end of each flange 306f, as known in the art. By applying a bending force that is greater than the yield strength of each flange 306f in the fold area, the flange 306f may be caused to remain in its folded position without the use of a bonding agent. Optionally, however, a bonding agent (not shown), such as epoxy, or other adhesive as known in the art, may be applied to a portion of the upper surface of the core member 306, the surface of the flanges 306f, or both, prior to the folding process. The bonding agent may provide additional adhesion to prevent the flanges 306f from moving away from the upper surface of the core member 306. Alternatively, spot welding may be used to secure flanges 306f to the central portion of core member 306.

Figure 4:
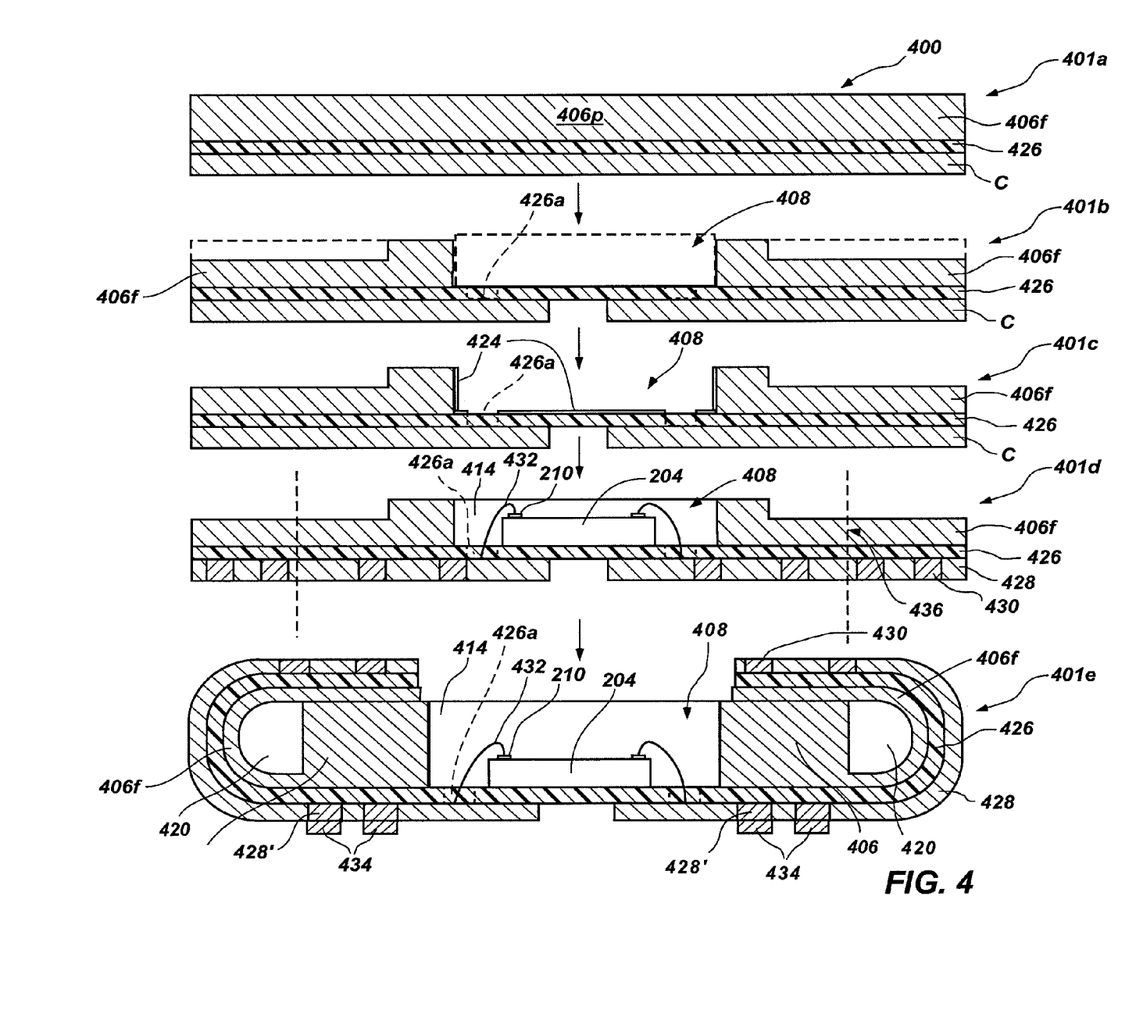
FIG. 4 depicts an embodiment of a sequence of acts in a method of manufacturing a Chip-On-Board assembly according to an embodiment of the present invention.

Another embodiment of a method of forming a COB package may be seen in FIG. 4. Segment 401a illustrates a precursor structure 400 including a metal or metal alloy core base 406p disposed over a dielectric layer 426, which, in turn, is disposed over a thinner conductive layer C.

Metal or alloy core base 406p is a precursor structure used to form a core member 406 and may be formed, by way of example only, by electroplating or electroless plating and may be of, for example, 500 µm thickness. Metal or alloy core base 406p may be adhered to the dielectric layer 426 by a bonding agent (not shown), such as an epoxy, adhesive, adhesive tape, among other methods known in the art. The bonding agent may be applied to the core base 406p, the dielectric layer 426, or both. One example of a flexible dielectric material may be a polyimide film or tape. Alternatively, dielectric layer 426 may be disposed on metal or alloy base 406p in flowable form, such as with a spin-on technique.

Conductive layer C is a precursor structure used to form conductive traces 428 that terminate at terminal pads 430, which may be formed by the aforementioned masking, patterning and etching after conductive layer C is applied or blanket-deposited onto dielectric layer 426. Alternatively, conductive traces 428 may be preformed and applied to dielectric layer 426.

Segment 401b of FIG. 4 illustrates an intermediate act in the manufacturing process. Cavity 408, which may form a recess 208 for receiving a semiconductor die 204, as seen in FIG. 2, may be formed in the core base 406p by mechanical techniques, such as milling, chemical techniques, such as a masking, patterning and chemical (wet) etching process, or other suitable method of forming cavities in metals, as known in the art. The depth of the cavity 408 may be substantially the same as or greater than the height of a semiconductor die 204 to be disposed therewithin, although a cavity having a depth less than the height of the semiconductor die 204 falls within the scope of the invention. Cavity 408 may stop on dielectric layer 426, after which apertures 426a are formed in dielectric layer 426 adjacent the intended location of a semiconductor die 204, and through which conductive elements 432 may be subsequently extended between bond pads 210 of a semiconductor die 204 and the upper surfaces of conductive traces 428 exposed through apertures 426a. If cavity 408 does not stop on dielectric layer 426 but stops instead on conductive layer C, an optional act as described with reference to segment 401c of FIG. 4 may be performed.

Flanges 406f may also be formed in core base 406p by mechanical techniques, such as milling, chemical techniques, such as a masking, patterning and chemical etching process, or other suitable methods of reducing a thickness of a metal that are known in the art. The volume of core base 406p removed in the process to form the flanges 406f may be substantially sufficient to ensure that the flanges 406f have the requisite ductility needed to plastically fold a portion of each flange 406f back toward the central portion of core base 406p, as discussed below.

Flanges 406f, flanking the central portion of core base 406p and spaced from cavity 408, may also be formed in the core base 406p by thinning using mechanical techniques, such as milling, chemical techniques, such as a masking, patterning and chemical (wet) etching process, or other such methods of reducing a thickness of a metal that are known in the art, the resulting structure now comprising core member 406, corresponding to core member 206 of FIG. 2. Flanges 406f correspond to flange members 206f of the core member 206 as seen in FIG. 2. The volume of core base 406p removed in the process to form the flanges 406f may be substantially sufficient to ensure the flanges 406f have the requisite ductility needed to plastically fold a portion of each flange 406f back toward the central portion of core member 406, as discussed below.

Segment 401c of FIG. 4 illustrates another, optional intermediate act in the manufacturing process, if dielectric layer 426 is removed during formation of cavity 408. A dielectric, passivating layer 424 may be disposed on the floor of cavity 408 of core member 406 and, optionally, over the walls of cavity 408. The dielectric layer 424 may be applied by a chemical vapor deposition (CVD) process, stereolithographic process using a dielectric photopolymer material, spray process, or other suitable methods known in the art. If only disposed on the floor of cavity 408, dielectric layer 424 may comprise a preformed dielectric tape or film, as previously mentioned. In either instance, the dielectric layer 424 electrically isolates a semiconductor die 204 (see segment 401d of FIG. 4) placed thereon from conductive traces 428. Apertures 426a may be formed, using conventional etching techniques, through dielectric layer 424 for extending conductive elements 432 (see segments 401d, 401e of FIG. 4) from semiconductor die 204 to the upper sides of conductive traces 428. If a preformed dielectric tape or film is employed for dielectric layer 424, apertures 426a may be preformed therein. If stereolithography is employed to form dielectric layer 424, the apertures 426a may be formed in situ during activation or disposition of the photopolymer, depending on the specific stereolithographic technique employed. Optionally, if conductive layer C is configured with a die paddle under cavity 408 and semiconductor die 204 electrically connected thereto for ground or bias purposes, an aperture (not shown) for electrically connecting the back side of semiconductor die 204 may be provided in dielectric layer 424 or, if dielectric layer 426 has not been removed, in dielectric layer 426. In either instance, a conductive or conductor-filled epoxy paste, or a solder paste, may be used to effect a physical and electrical connection with the back side of semiconductor die 204.

Segment 401d of FIG. 4 illustrates positioning a semiconductor die 204 within the cavity 408 of core member 406. A bonding agent (not shown), such as an epoxy, thermoset or thermoplastic adhesive, heat or light curable polymer, adhesive coated tape, or the like, may be applied to the floor of cavity 408 over the dielectric layer 426 to secure semiconductor die 204 by its back side with peripheral bond pads 210 proximate apertures 426a in dielectric layer 426, unless dielectric layer 426 is already adhesive in nature. Alternatively, the bonding agent may be applied to the semiconductor die 204 in the form of, for example, LOC (Leads On Chip) adhesive coated tape segments. Semiconductor die 204 may be positioned within the cavity 408 by a pick and place apparatus using, for example, a vacuum quill, or other by another suitable technique known in the art.

A wire bonding process, or a TAB process, may be used to form or connect conductive elements 432, joining at least some of the bond pads 210 on the semiconductor die 204 through the apertures 426a in dielectric layer 426 to proximate ends of the conductive traces 428 disposed on the dielectric layer 426.

Also visible in segment 401e of FIG. 4 are conductive interconnects in the form of discrete conductive elements 434, corresponding to discrete conductive elements 234 of FIG. 2 and which, as shown in FIG. 2, may be of various configurations. The discrete conductive elements 434 may be formed or disposed on enlarged areas 428' of conductive traces 428 disposed on the dielectric layer 426 and provide, in conjunction with the conductive traces 428 and conductive elements 432, external electrical communication for the semiconductor die 204. A dielectric encapsulant 414, such as an underfill compound, may be dispensed within the cavity 408 to protect the back side and sides of semiconductor die 204. Alternatively, stereolithographic techniques using a photopolymer may be employed, or pot molding of a resin, or glob top encapsulation using a silicone. Encapsulation may be effected prior to, or after, formation or disposition of discrete conductive elements 434 on conductive traces 428.

Segment 401e of FIG. 4 illustrates a completed semiconductor device assembly after the flanges 406f of the core member 406 have been folded over the top of the core member 406 to locations proximate cavity 408, resting and in contact with unthinned portions of core member 406. Voids 420 are formed between fold-over flanges 406f and the central portion of core member 406. Dashed vertical lines 436, visible in segment 401d of FIG. 4, indicate the approximate location of the fold, it being understood that the length of flanges 406f as depicted are not to scale. The folding process is a simple mechanical process, and effected using conventional trim-and-form equipment by applying a bending force at or substantially near the distal end of each flange 406f, as known in the art. By applying a bending force that is greater than the yield strength of each flange 406f in the fold area, the flange 406f may be caused to remain in its folded position without the use of a bonding agent. Optionally, however, a bonding agent (not shown), such as epoxy, or other adhesive as known in the art, may be applied to a portion of the upper surface of the core member 406, the surface of the flanges 406f, or both, prior to the folding process. The bonding agent may provide additional adhesion to prevent the flanges 406f from moving away from the upper surface of the core member 406. Alternatively, spot welding may be used to secure flanges 406f to the central portion of core member 406.

Figure 5:
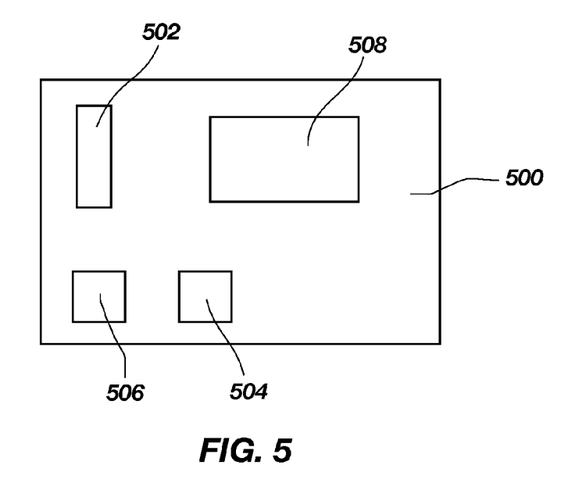
FIG. 5 depicts a block diagram of a system including semiconductor dice packaged in accordance with one or more embodiments of the present invention.

FIG. 5 of the drawings depicts, in schematic block form, an embodiment of a system 500 including at least one semiconductor device assembly according to one or more embodiments of the present invention. System 500 may comprise, by way of nonlimiting example only, a personal computer, a server, a cell phone, a personal digital assistant (PDA), a camera, or any other system comprising a processor 502 and memory 508 and, optionally, an input device 504 and an output device 506.

While the invention has been described in terms of certain illustrated embodiments and variations thereof, it will be understood and appreciated by those of ordinary skill in the art that the invention is not so limited. Rather, additions, deletions and modifications to the illustrated embodiments may be effected without departing from the spirit and scope of the invention as defined by the claims that follow.

What is claimed is:

1. An interposer substrate, comprising:
   a thermally and electrically conductive core member comprising:
      a recess for at least partially receiving a semiconductor die therein; and
      at least one flange member including a proximal portion extending laterally away from the recess to an intermediate portion and a distal portion extending laterally toward the recess from the intermediate portion;
   a dielectric disposed over at least a portion of the electrically conductive core member on a surface thereof opposite a location of the recess and extending from proximate the recess over the at least one flange member to the distal portion thereof; and
   at least one conductor disposed over the dielectric and extending from proximate the recess over the at least one flange member to the distal portion thereof.

2. The interposer substrate of claim 1, wherein the electrically conductive core member comprises a metal material.

3. The interposer substrate of claim 1, wherein the recess of the electrically conductive core member resides in a portion thereof of a thickness and the at least one flange member is of another, lesser thickness.

4. The interposer substrate of claim 3, wherein a surface of the at least one flange member is coextensive with a surface of the portion of the electrically conductive core member in which the recess resides.

5. The interposer substrate of claim 1, wherein the recess is of sufficient depth to receive a semiconductor die entirely therein.

6. The interposer substrate of claim 1, further comprising:
   at least one conductive element disposed on the at least one conductor proximate the recess and over the proximal portion of the at least one flange member.

7. The interposer substrate of claim 6, wherein the at least one conductor extends between the at least one conductive element and the distal portion of the at least one flange member.

8. The interposer substrate of claim 1, further comprising at least one aperture extending through the electrically conductive core member between the recess and an exterior surface of the electrically conductive core member.

9. The interposer substrate of claim 8, wherein the at least one aperture is sized and configured to expose at least one bond pad of a semiconductor die at least partially received in the recess with an active surface of the semiconductor die facing a floor of the recess.

10. The interposer substrate of claim 1, wherein the electrically conductive core member consists of a single structure.

11. The interposer substrate of claim 1, wherein the recess extends partially through the electrically conductive core member from one surface thereof.

12. The interposer substrate of claim 1, wherein the recess extends through the electrically conductive core member from one surface thereof to another, opposing surface thereof 13. The interposer substrate of claim 1, wherein the intermediate portion of the at least one flange member comprises an arcuate portion extending between the proximal portion and the distal portion of the at least one flange member.

14. The interposer substrate of claim 1, wherein the distal portion of the at least one flange member extends over a portion of the electrically conductive core member in which the recess resides.

15. The interposer substrate of claim 14, wherein the distal portion is secured to the portion of the electrically conductive core member in which the recess resides.

16. The interposer substrate of claim 14, wherein the at least one flange member and the portion of the electrically conductive core member in which the die resides define a void therebetween.

17. The interposer substrate of claim 1, wherein the at least one flange member comprises two flange members extending on opposing sides of a portion of the electrically conductive core member in which the recess resides.

18. The interposer substrate of claim 17, wherein the portion of the electrically conductive core member in which the recess resides is of greater thickness than a thickness of the two flange members.

19. The interposer substrate of claim 1, further comprising at least one conductive via extending between the at least one conductor and the recess.

20. The interposer substrate of claim 1, further comprising at least one conductive element disposed on the at least one conductor over the distal portion of the at least one flange member.

21. The interposer substrate of claim 1, further comprising an anisotropic conductive material disposed on the at least one conductor over the distal portion of the at least one flange member.

22. A semiconductor device assembly comprising:
an interposer substrate, comprising:
  a thermally and electrically conductive core member comprising:
    a recess adapted to at least partially receive a semiconductor die therein; and
    at least one flange member including a proximal segment extending laterally away from the recess to an intermediate segment and a distal segment extending laterally toward the recess from the intermediate segment;
  a dielectric disposed over at least a portion of the electrically conductive core member on a surface thereof opposite a location of the recess and extending from proximate the recess over the at least one flange member to the distal segment thereof; and
  at least one conductive trace disposed over the dielectric and extending from proximate the recess over the at least one flange member to the distal segment thereof;
a semiconductor die at least partially received in the recess; and
a plurality of conductive elements, at least one of the plurality of conductive elements connecting at least one bond pad disposed on an active surface of the semiconductor die and the at least one conductive trace.

23. The semiconductor device assembly of claim 22, wherein the recess extends partially through the electrically conductive core member from one surface thereof, the semiconductor die is received in the recess with the active surface thereof facing a floor of the recess through which at least one aperture extending through the electrically conductive core member between the recess and an exterior surface of the electrically conductive core member extends, and the at least one aperture is sized and configured to expose the plurality of bond pads of the semiconductor die.

24. The semiconductor device assembly of claim 23, wherein the plurality of conductive elements extends through the at least one aperture.

25. The semiconductor device assembly of claim 22, wherein the recess extends through the electrically conductive core member from one surface thereof to another, opposing surface thereof and the semiconductor die is received in the recess with the active surface thereof facing away from an end of the at least one conductive trace proximate the at least one aperture.

26. The semiconductor device assembly of claim 25, wherein the plurality of conductive elements extends to a side of the at least one conductive trace facing the semiconductor die.

27. The semiconductor device assembly of claim 22, wherein at least one interior surface defining the recess and on which the semiconductor die resides is covered with a dielectric.

28. The semiconductor device assembly of claim 22, wherein the recess is filled around the semiconductor die with a dielectric at least to a level to cover a portion of sides thereof.

29. The semiconductor device assembly of claim 22, wherein the recess is of sufficient depth to entirely receive the semiconductor die therein, and the recess is filled with a dielectric to a level sufficient to cover sides of the semiconductor die and extend completely thereover.

30. An electronic system, comprising:
a processor; and
memory;
wherein at least one of the processor and the memory comprises a semiconductor die assembly, including:
  an interposer substrate, comprising:
    a thermally and electrically conductive core member comprising a proximal segment extending laterally away from a recess to an intermediate segment and a distal segment extending laterally toward the recess from the intermediate segment, wherein the recess is configured to at least partially receive a semiconductor die therein;
    a dielectric disposed over at least a portion of the electrically conductive core member on a surface thereof opposite a location of the recess and extending from proximate the recess to the distal segment thereof; and
    at least one conductor disposed over the dielectric and extending from proximate the recess to the distal segment thereof;
  a semiconductor die having an active surface bearing a plurality of bond pads disposed with at least a portion thereof received in the recess; and
  at least one conductive element connecting at least one bond pad of the semiconductor die and the at least one conductor.

* * * * *

UNITED STATES PATENT AND TRADEMARK OFFICE
CERTIFICATE OF CORRECTION

PATENT NO. : 8,115,112 B2
APPLICATION NO. : 12/201222
DATED : February 14, 2012
INVENTOR(S) : David J. Corisis et al.

Page 1 of 1

It is certified that error appears in the above-identified patent and that said Letters Patent is hereby corrected as shown below:

In column 14, line 67, in Claim 12, delete "thereof" and insert -- thereof. --, therefor.

Signed and Sealed this
Third Day of April, 2012

David J. Kappos
*Director of the United States Patent and Trademark Office*